United States Patent [19]
Biggs et al.

[11] Patent Number: 5,535,398
[45] Date of Patent: Jul. 9, 1996

[54] METHOD AND APPARATUS FOR PROVIDING BOTH POWER AND CONTROL BY WAY OF AN INTEGRATED CIRCUIT TERMINAL

[75] Inventors: Terry L. Biggs, Dripping Springs; Donald L. Tietjen; Jesse R. Wilson, both of Austin, all of Tex.

[73] Assignee: Motorola Inc., Schaumburg, Ill.

[21] Appl. No.: 842,951

[22] Filed: Feb. 28, 1992

[51] Int. Cl.⁶ ................. G06F 1/16; G06F 1/08
[52] U.S. Cl. ...................... 395/750; 395/550
[58] Field of Search ................ 395/550, 750; 364/270, 270.3

[56] References Cited

U.S. PATENT DOCUMENTS

| | | | |
|---|---|---|---|
| 4,893,271 | 1/1990 | Davis et al. | 395/550 |
| 4,931,748 | 6/1990 | McDermott | 331/1 A |
| 5,133,064 | 7/1992 | Hotta et al. | 395/550 |
| 5,134,703 | 7/1992 | Bumbarger | 395/550 |
| 5,155,841 | 10/1992 | Bumbarger | 395/550 |

OTHER PUBLICATIONS

Terry Lawell, "Integrated Pass-Through Logic", Jan. 1982, Motorola Technical Developments vol. 2, p. 15.

*Primary Examiner*—Kevin A. Kriess
*Assistant Examiner*—Dennis M. Butler
*Attorney, Agent, or Firm*—Susan C. Hill

[57] ABSTRACT

A method and apparatus for providing both power and control by way of an integrated circuit terminal (22). In one form, a clock source (12) supplies a periodic signal to a phase lock loop circuit (32) and to a multiplexer (34). The output of the phase lock loop circuit (32) is a second input to the multiplexer (34). The phase lock loop circuit (32) receives its power from a power and control pin (22). The multiplexer (34) receives its power from a power pin (24). The power and control pin (22) is used as a control input to multiplexer (34). Multiplexer (34) uses the power and control pin (22) to select which input to output as a system clock.

27 Claims, 4 Drawing Sheets

METHOD AND APPARATUS FOR PROVIDING BOTH POWER AND CONTROL BY WAY OF AN INTEGRATED CIRCUIT TERMINAL

FIELD OF THE INVENTION

The present invention relates to integrated circuits, and more particularly to providing both power and control by way of an integrated circuit terminal.

BACKGROUND OF THE INVENTION

As microcomputer customers require more user selectable functions on a microcomputer, methods must be found to include these user selectable functions without increasing the cost of the microcomputer. Using pins as control inputs is one way to allow more user selectable functions on a microcomputer. However, merely increasing the number of pins to add user selectable functions is generally not a feasible solution because it usually increases the cost of the microcomputer integrated circuit by increasing the cost of the package.

A significant portion of the cost of a microcomputer integrated circuit is the package. With most package types, the more pins the package has, the higher the cost of the package. Also, there are certain standard packages which are capable of accommodating only up to a certain maximum number of pins. If the microcomputer requires more pins than can be accommodated by that standard package, another generally more expensive package must be used. For example, a particular standard package may have one hundred and twenty-eight pins. A microcomputer that requires one hundred and twenty-nine pins cannot use that standard package because it does not supply enough pins. Thus a larger, more expensive package must be used.

A less expensive solution than using more pins is to multiplex different functions on the same pin. But there is a limit as to how many different functions can be multiplexed on a pin before the different functions start interfering with each other. For example, one pin can serve a dual purpose by having one function during power up and having another function during normal operation. But a third function cannot be added if it would interfere with either the first or the second function already performed by the pin. New ways of multiplexing multiple functions on existing pins are needed.

DESCRIPTION OF THE PREFERRED EMBODIMENT

The term "power" or "power input" as used in this specification means a positive power supply voltage which is used to supply power to electronic circuitry, but has no other affect on the circuitry. "Power" as used in this sense is distinguished from "control" or "select" inputs. "Control" or "select" inputs are not used to supply power to electronic circuitry, but instead are used to control the functionality of the circuitry by affecting the outputs produced by the circuitry. A circuit does not function until it receives power, but once it receives power, the "power" input has no additional affect on the circuit. A circuit need not receive a "control" or "select" input in order to function, but once it receives a "control" or "select" input, the "control" or "select" input affects the functionality of the circuitry by affecting the outputs produced by the circuitry. "Control information" is used synonymously with the terms "control" and "control inputs".

The present invention allows a power pin to be used as both a power pin and a control pin. This power pin can be used as only a power pin by a first circuit, used as only a control pin by a second circuit, and used as both power and control by a third circuit. The primary function of a power pin is to supply power to circuitry on the chip. However, using the power pin as a control pin allows a user selectable function to be optionally grafted onto the primary function of the power pin. It also allows power consumption to be reduced when a circuit is not required by the user. Using a power pin as a power/control pin is especially useful in the context of selecting how the system clock on the chip will be generated, both during power up and during normal operation of the microcomputer system.

Figure 2:
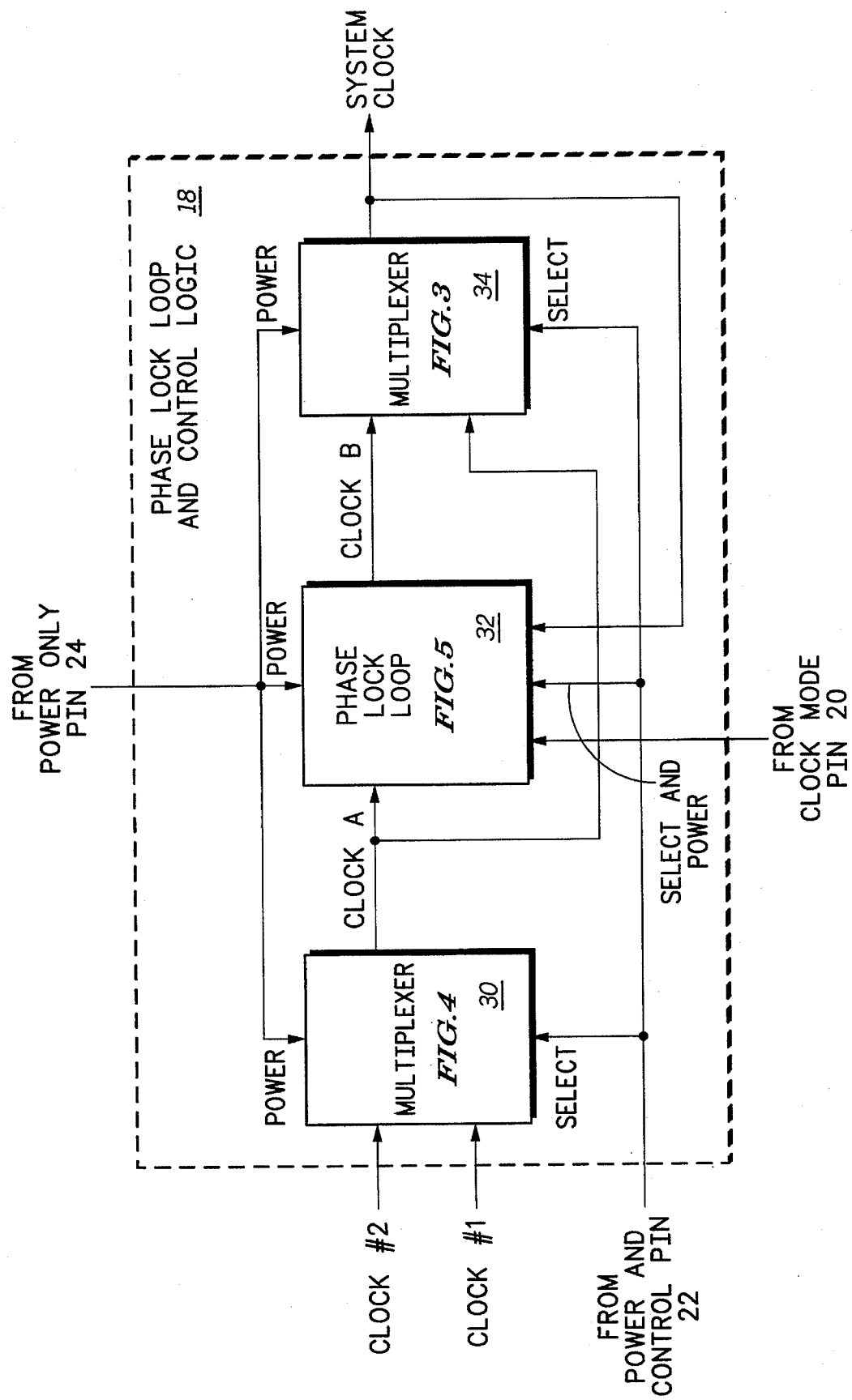
FIG. 2 illustrates, in block diagram form, a phase lock loop and control logic circuit 18 of FIG. 1 in accordance with one embodiment of the present invention.

One of the areas in which customers are requiring more user selectable functions on a microcomputer is the area of clock operation. Microcomputers use a system clock signal internally in order to supply necessary clock signals to the circuitry throughout the chip. This system clock is either provided directly to the microcomputer from an external clock source or is generated on the microcomputer chip using an external clock source as a base signal. An example of a prior art clock signal generating apparatus using a crystal oscillator is illustrated in FIG. 2 of McDermott et al., U.S. Pat. No. 4,931,748.

The external clock source can be anything that generates an oscillating signal, for example, a crystal, another semiconductor chip, or a special circuit that generates a repeating waveform such as a sine, cosine, trapezoid, or square waveform. However, if the system clock is provided directly to the microcomputer from an external clock source, the waveform supplied by the external clock source must meet more stringent requirements.

If an external crystal is used, the crystal frequency is sometimes considerably lower than the required system clock frequency. Also, the off-chip crystal generates a waveform that is more similar to a sine wave or a trapezoid wave than the required square wave because the rise and fall times are extended. Throughout this specification, such a waveform with long rise and fall times will be referred to as a trapezoid wave.

Thus circuitry is required on the microcomputer in order to properly condition the signal supplied by the crystal so that it can be used to generate a system clock. The first step is to convert the trapezoid wave of the crystal to a square wave. The second step, which is not required if a fast enough crystal is used, is to use the square wave to generate a system clock with the desired frequency. The final step is to minimize the skew between the clock pulses that are being sent out as system clock pulses and the clock pulses being received from the external clock source. This is accomplished using a feedback path in a phase lock loop circuit.

Instead of using an external crystal, some customers find it desirable to provide an external clock signal directly to the microcomputer from an external clock source. If an external clock signal is provided directly to the microcomputer, only one pin is needed to input this clock signal. An external crystal, on the other hand, requires two pins. If this external clock signal, unlike the crystal input, does not require any conditioning by the microcomputer, then it can be used directly as the system clock.

When an external clock signal is used directly as the system clock, the user is able to vary the speed of operation of the entire microcomputer chip merely by varying the frequency of the external clock signal. However, passing an external clock signal through the conditioning circuitry required by the crystal input may cause problems, such as a delay in how quickly a frequency change takes effect. If the functioning of the phase lock loop circuitry cannot be suspended or bypassed when an external clock signal is used to direct drive the microcomputer, then an unacceptable delay may be incurred when the user attempts to slow down or speed up the microcomputer by changing the frequency of the external clock signal. The delay is incurred between a change in the frequency of the external clock signal and the desired change in the frequency of the system clock.

This delay, caused by the conditioning circuitry, may be unacceptable to some microcomputer customers. In addition to causing an undesirable delay, the conditioning circuitry also consumes power without generating any useful function when an external clock signal is used directly as the system clock. It is thus desirable for the user to be able to select whether to use the conditioning circuitry or to bypass the conditioning circuitry.

Figure 1:
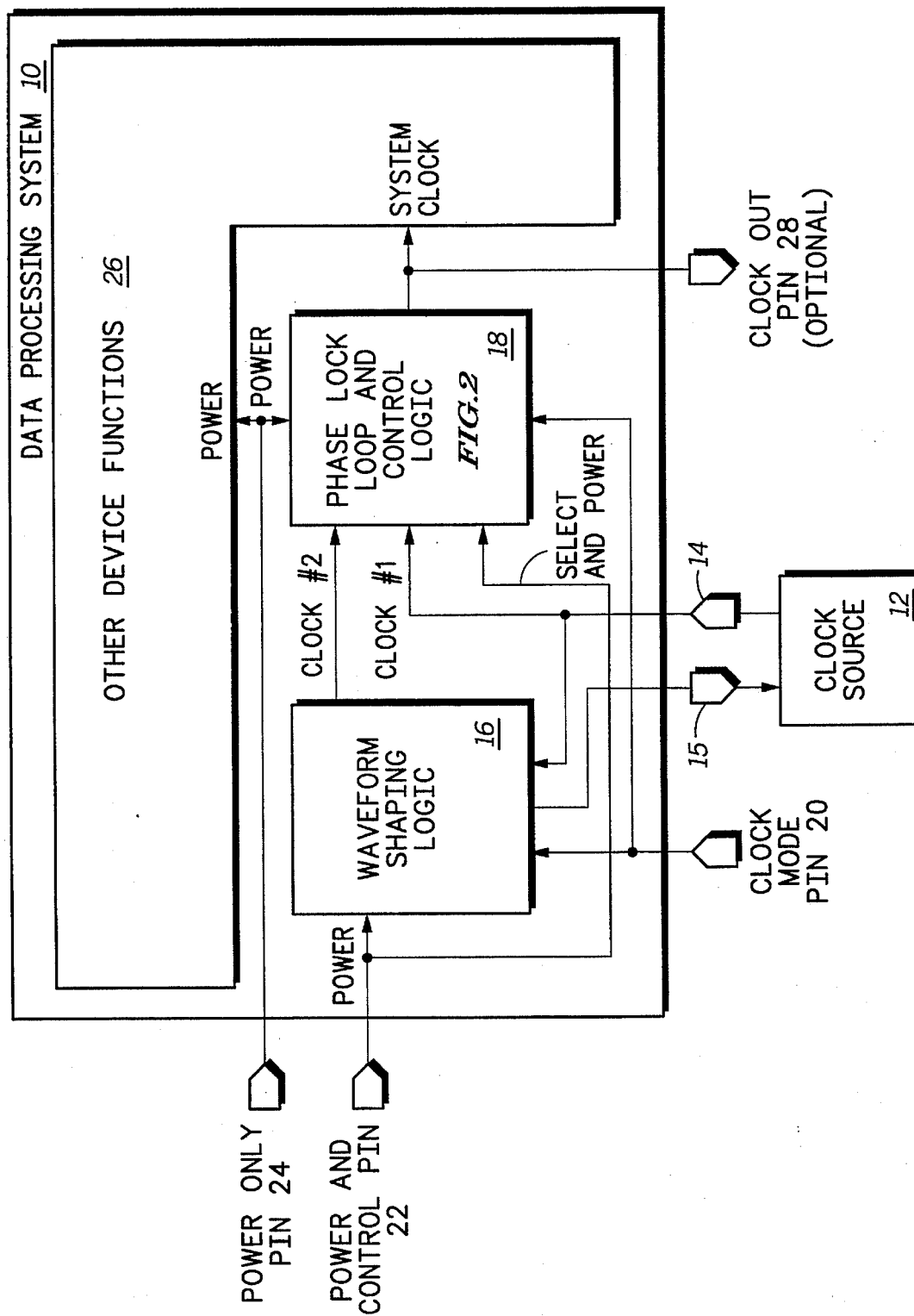
FIG. 1 illustrates, in block diagram form, a data processing system and a clock source in accordance with one embodiment of the present invention.

FIG. 1 illustrates a data processing system 10. Although data processing system 10 is a microcomputer chip in the present embodiment, data processing system 10 could be any type of semiconductor chip that requires a clock to operate its internal circuitry.

A clock source circuit 12 supplies a periodic signal to data processing system 10 through an input pin 14. In the present embodiment, clock source 12 is either a crystal or a non-crystal clock source such as another integrated circuit. When a crystal is used as clock source 12, an output pin 15 is also required so that waveform shaping logic 16 can supply a stimulus to the crystal. When a non-crystal clock source is used as clock source 12, output pin 15 is not used. Clock source 12 is an input to both waveform shaping logic circuit 16 and to a phase lock loop and control logic circuit 18. A clock mode signal is input through a clock mode pin 20 to both waveform shaping logic 16 and phase lock loop and control logic 18.

A power and control signal is input through a power and control pin 22 to both waveform shaping logic 16 and phase lock loop and control logic 18. The power and control pin 22 provides power to the waveform shaping logic 16 and provides both a select input and power to the phase lock loop and control logic 18. The control function performed by the power and control pin 22 is labelled a "select" function in the present embodiment. In other embodiments, the control function performed by the power and control pin 22 could be any type of control function. A select function is merely one type of control function which can be performed by the power and control pin 22.

A power only signal is input through a power only pin 24 to both phase lock loop and control logic 18 and to other device functions circuitry 26. In the present embodiment, the sole purpose of power only pin 24 is to supply power to the circuits to which it is connected. In the present embodiment, multiple power only pins 24 are actually used because the data processing system 10 is quite large and requires more current than one power only pin 24 can supply. The multiple power only pins 24 are all electrically coupled together to the same supply of power. However, other smaller data processing systems may only require one power only pin 24. Note that in other embodiments, power only pin 24 could be a second power and control pin that supplied power, or control, or power and control.

Waveform shaping logic 16 generates and outputs a clock signal called CLOCK #2 to phase lock loop and control logic 18. Phase lock loop and control logic 18 outputs a signal called system clock to the other device functions 26. This system clock is also optionally output through clock out pin 28 as a clock out signal.

In operation, clock source 12 supplies a periodic signal to data processor 10 which is used by waveform shaping logic 16 and phase lock loop and control logic 18 in order to produce a system clock signal. This system clock signal, with some possible phase skew, is then used throughout the other device functions 26 to serve as the clock for this circuitry.

Clock source 12 can supply three possible types of periodic signals that can be input to data processing system 10 through input pin 14. These three types of periodic signals will be fully described after all of the figures have been introduced. The three types of periodic signals require a different amount of conditioning and thus must be treated differently by waveform shaping logic 16 and phase lock loop and control logic 18. As a result, the data processing system 10 must be informed by the user as to which type of periodic signal the user is inputting. The data processing system 10 then uses that information to determine how to control waveform shaping logic 16 and phase lock loop and control logic 18.

If data processing system 10 does not have the correct information and thus does not properly control waveform shaping logic 16 and phase lock loop and control logic 18, then the system clock may not be properly generated and the other device functions 26 may not operate properly. In other words, if the system clock is not generated properly, the data processing system 10 may not function properly.

The user must use input pins rather than a control register in order to inform the data processing system 10 as to which type of periodic signal the user is inputting. This is because the user does not have the ability to write control information to a control register until the system clock is up and running the internal circuitry on the data processing system 10. Thus, the generation of the system clock must be performed during power up and the user must use input pins to supply control information regarding the generation of the system clock.

The disclosed embodiment of the present invention is a digital data processor 10 which uses digital inputs that can have only one of two digital logic levels. The voltage on a digital input pin represents either a digital logic level one or a digital logic level zero. In the present embodiment, a positive power supply voltage on an input pin represents a digital logic level one, and a grounded input pin represents a digital logic level zero. In other embodiments, a positive power supply voltage on an input pin could represent a digital logic level zero, and a grounded input pin could represent a digital logic level one.

One digital input pin alone can only represent two possible digital logic levels. But clock source 12 can supply three possible types of periodic signals. Thus a second digital input pin, in addition to clock mode pin 20, is needed in order to inform data processing system 10 as to which of the three types of periodic signals the user is inputting. So in order to select between three possibilities, a binary system such as digital data processing system 10 requires two input pins. But in the present embodiment, no extra input pins were readily available. And the addition of a completely new pin was most likely cost prohibitive because it required the use of a larger or non-standard package that had more pins.

A way was found to share the functionality of an existing pin, a power pin, in order to gain more functionality for the user and to additionally gain the benefit of reducing the power consumption of circuitry that is not used for all types of periodic signals. A discussion of how this was accomplished will be deferred until all of the figures have been described.

FIG. 2 illustrates one implementation of the phase lock loop and control logic 18 of FIG. 1. Multiplexer circuit 30 receives a CLOCK #1 input, a CLOCK #2 input, a power input from the power only pin 24, and a select input from the power and control pin 22. Multiplexer 30 outputs a CLOCK A signal to a phase lock loop circuit 32 and to a multiplexer circuit 34. Phase lock loop 32 receives a power input from the power only pin 24, both a select and a power input from the power and control pin 22, and an input from the clock mode pin 20. Phase lock loop 32 outputs a CLOCK B signal to multiplexer 34. Multiplexer 34 receives a power input from the power only pin 24, and a select input from the power and control pin 22. Multiplexer 34 outputs a system clock signal which is fed back as an input to phase lock loop 32 and which is also output from phase lock loop and control logic 18. The operation of the phase lock loop and control logic 18 will be more fully described below.

Figure 3:
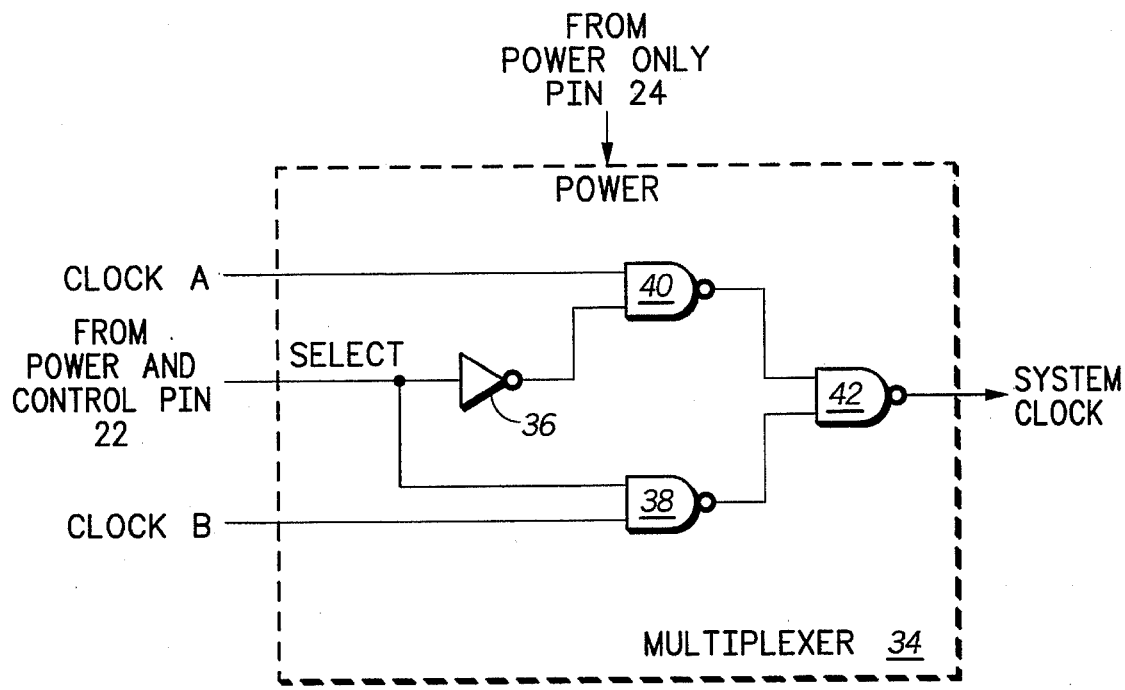
FIG. 3 illustrates, in logic diagram form, a multiplexer 34 of FIG. 2 in accordance with one embodiment of the present invention.

FIG. 3 illustrates one implementation of the multiplexer circuit 34 of FIG. 2. All of the circuitry within multiplexer 34 receives power from the power only pin 24. Power and control pin 22 supplies no power to multiplexer 34, but is instead used only as a select or control signal. Power and control pin 22 is a select input to an inverter 36 and a select input to a NAND gate 38. CLOCK B is the second input to NAND gate 38. CLOCK A and the output of inverter 36 are the two inputs to a NAND gate 40. The output of NAND gate 38 and the output of NAND gate 40 are inputs to NAND gate 42. The output of NAND gate 42 is a signal called system clock.

Figure 4:
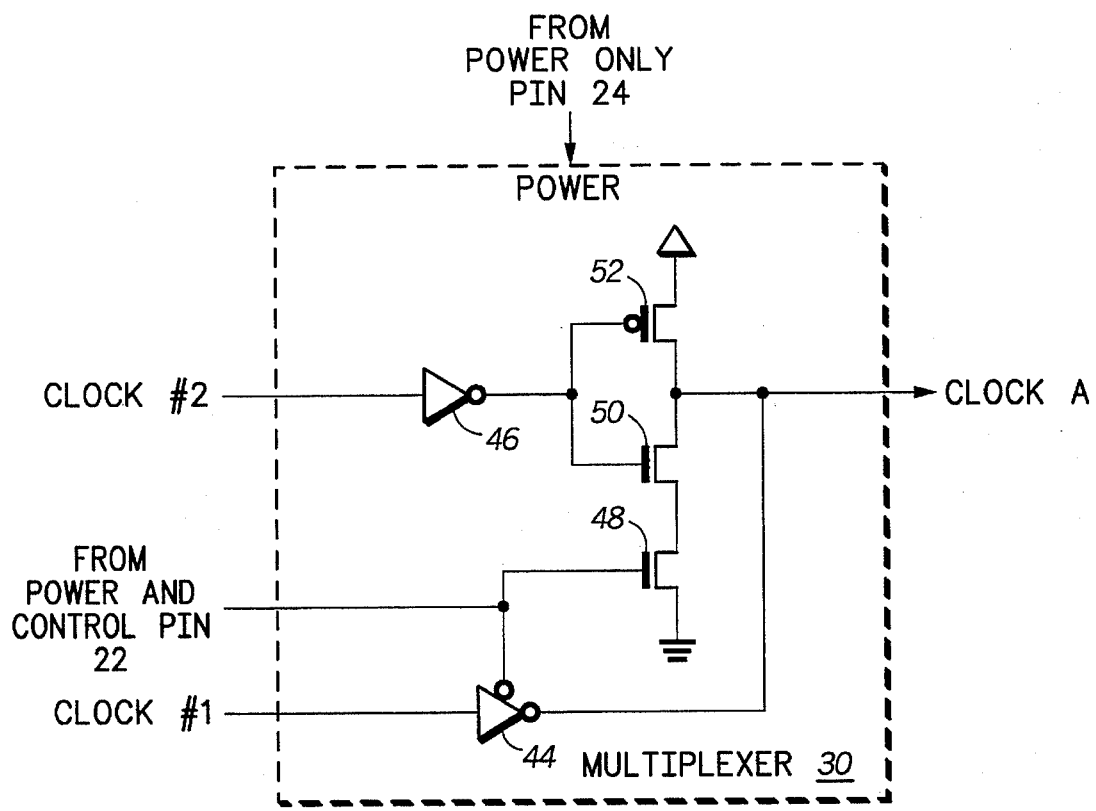
FIG. 4 illustrates, in partial logic diagram form, a multiplexer 30 of FIG. 2 in accordance with one embodiment of the present invention.

FIG. 4 illustrates one implementation of the multiplexer circuit 30 of FIG. 2. All of the circuitry within multiplexer 30 receives power from the power only pin 24. Power and control pin 22 supplies no power to multiplexer 30, but is instead used only as a select or control signal. Power and control pin 22 is a select or enable input to an inverter 44. CLOCK #1 is the input to inverter 44. CLOCK #2 is the input to an inverter 46. Transistor 48 is an n-channel MOSFET that has a drain coupled to a source of a transistor 50, a source coupled to ground, and a gate coupled to the power and control pin 22. Transistor 50 is an n-channel MOSFET that has a drain coupled to a drain of a transistor 52, and a gate coupled to the output of inverter 46. Transistor 52 is a p-channel MOSFET that has a source coupled the power only pin 24, and a gate coupled to the output of inverter 46. The output of inverter 44, labelled CLOCK A, is coupled to the drain of transistor 52 and the drain of transistor 50.

Figure 5:
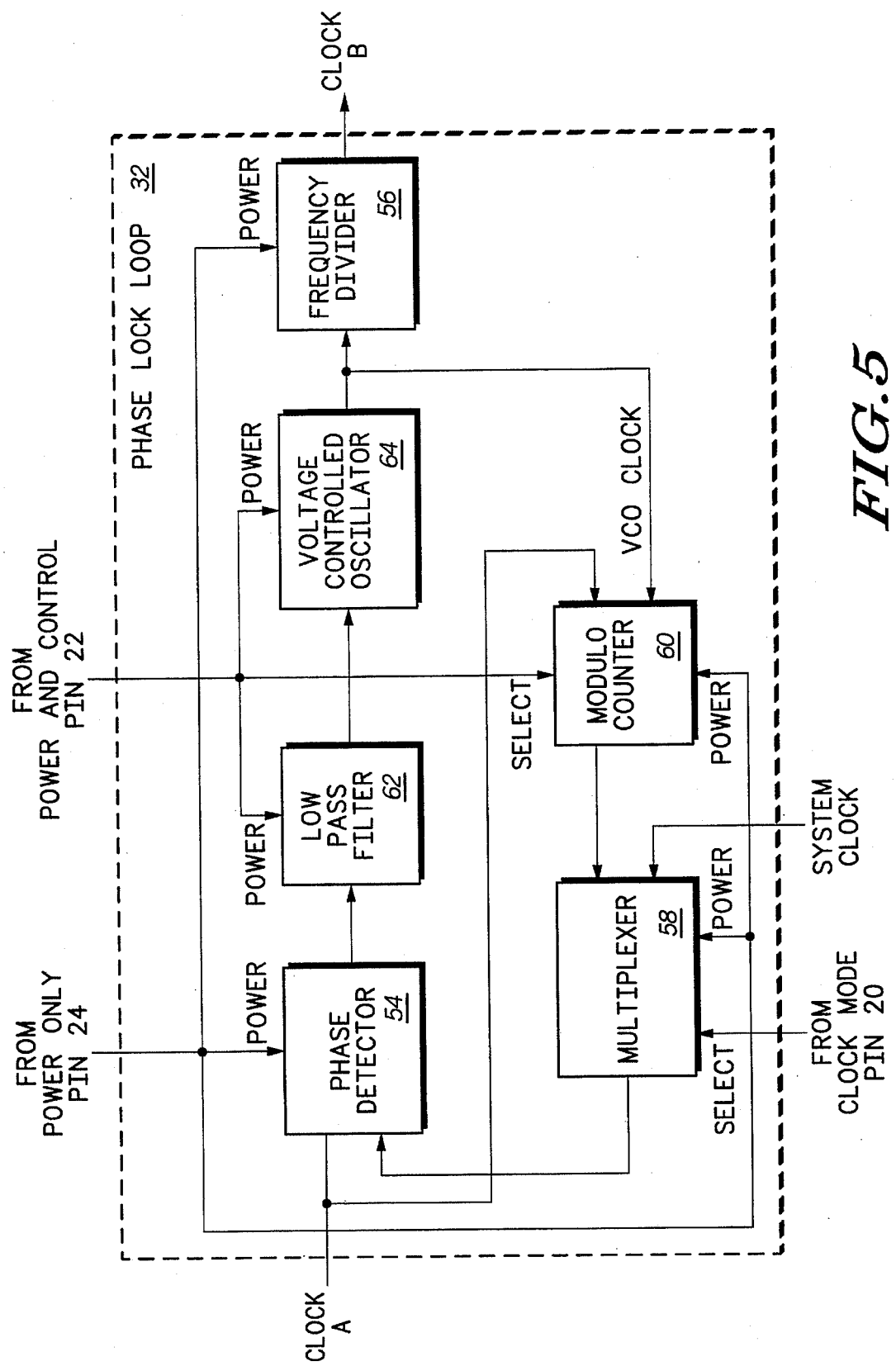
FIG. 5 illustrates, in block diagram form, a phase lock loop circuit 32 of FIG. 2 in accordance with one embodiment of the present invention.

FIG. 5 illustrates one implementation of the phase lock loop circuit 32 of FIG. 2. Power only pin 24 is the sole power input to a phase detector circuit 54, a frequency divider circuit 56, a multiplexer circuit 58, and a modulo counter circuit 60. Power and control pin 22 is the sole power input to a low pass filter circuit 62 and a voltage controlled oscillator circuit 64. Power and control pin 22 is also a select input to modulo counter 60.

CLOCK A is an input to phase detector 54 and modulo counter 60. Phase detector 54 outputs a signal to low pass filter 62. Low pass filter 62 outputs a signal to voltage controlled oscillator 64. Voltage controlled oscillator outputs a signal to both the frequency divider 56 and the modulo counter 60. Frequency divider 56 outputs a signal called CLOCK B. Modulo counter 60 outputs a signal to multiplexer 58. Multiplexer 58 receives the system clock as an input, and also receives an input from the clock mode pin 20. Multiplexer 58 outputs a signal to phase detector 54.

In operation, the phase lock loop circuit 32 works very much like a standard phase lock loop circuit. The only difference is that phase lock loop 32 uses both a power only pin 24 and a power and control pin 22 to supply power and control information to various portions of the circuitry. The various portions of the circuitry still individually work in the standard fashion, regardless of where the power or control information came from. But the additional power and control pin 22 allows certain portions of the phase lock loop circuitry 32 to be bypassed and deactivated under user control in order to modify the functioning of phase lock loop circuit 32 and/or to reduce power consumption. In other embodiments of phase lock loop circuit 32, different portions of the circuitry could be selectively bypassed and/or deactivated using the power and control pin 22.

Referring now to FIGS. 1–5, the selection of the expected type of periodic signal from clock source 12 takes place during power up in order to allow the system clock to be generated as quickly as possible. In the present embodiment there are three possible types of periodic signals. Other embodiments could use more or less types of periodic signals. The first type of periodic signal is a low frequency periodic signal, usually from a crystal, that needs a considerable amount of conditioning. The second type of periodic signal is a high frequency periodic signal, from either an external crystal oscillator or a non-crystal clock source, that needs less conditioning. And the third type of periodic signal is a high frequency periodic signal, from either a crystal oscillator or a non-crystal clock source, that needs little or no conditioning. In fact, this third type of periodic signal may not function as required if it does not bypass some of the conditioning circuitry.

The power and control pin 22 is used as a control input to phase lock loop 32 in order to determine whether the functionality of the phase lock loop 32 is to be used or is to be bypassed. If the user sets the power and control pin 22 to ground, the functionality of the phase lock loop circuit 32 is bypassed and no CLOCK B signal is generated. On the other hand, if the user sets the power and control pin 22 to a positive power supply voltage, the phase lock loop circuit 32 functions as a standard phase lock loop and CLOCK B is generated. Power and control pin 22 is thus used to determine whether or not CLOCK B is generated by the phase lock loop circuit 32.

The power and control pin 22 is also used as a power input to some of the circuitry in phase lock loop 32. If the user intends to not use the functionality of the phase lock loop circuit 32 by setting the power and control pin 22 to ground, the portions of the phase lock loop circuit 32 which have the power and control pin 22 as their power input do not receive any power. Thus, these portions of the phase lock loop circuit 32 which are not powered are also not dissipating any wasted power. On the other hand, if the user sets the power and control pin 22 to a positive power supply voltage, all of the portions of the phase lock loop circuit 32 which have the power and control pin 22 as their power input receive power and perform their functions.

The power and control pin 22 is thus being used for a dual purpose. The power and control pin 22 is being used as a control input to select how the phase lock loop 32 will operate, and as a power input to turn off unneeded circuitry so that power dissipation is decreased. Different embodiments of the present invention can use the power and control pin 22 as power inputs and control inputs to different portions of the circuitry. The power only pin 24 is used as a constant power input to circuitry that must be used regardless of any options chosen by the user.

Although different embodiments of the present invention could have used the power and control pin 22 as power inputs and control inputs to different portions of the circuitry, the functioning of the present embodiment will now be described for the three types of periodic signals that can be chosen by the user in the present embodiment.

The first type of periodic signal will now be discussed. The first type of periodic signal is a low frequency periodic signal, usually from a crystal. Clock source 12 in this case is thus a low frequency crystal. In the present embodiment, the maximum system clock frequency is specified to be 16 megahertz and there is no specified minimum frequency. That means that the system clock can be any frequency at or below 16 megahertz. The oscillation frequency of the crystal, on the other hand, is specified to be between twenty-five kilohertz and fifty kilohertz, which is much lower than the frequency of the system clock chosen by most users.

For the first type of periodic signal, the user places a digital logic level one on the clock mode pin 20. The user also places a positive power supply voltage on the power and control pin 22. Thus all of the circuits that receive their power inputs from the power and control pin 22 will be powered and functional. As a result, the waveform shaping logic circuit 16 is powered and functional. And, in the phase lock loop circuit 32, the low pass filter 62 and the voltage controlled oscillator 64 are powered and functional. In the present embodiment, a positive power supply voltage on the power and control pin 22 represents a digital logic level one when the pin 22 is being used as a control input.

For the first type of periodic signal, the crystal oscillator generates a periodic waveform that is more similar to a trapezoid wave than a square wave. Thus circuitry is required on the microcomputer in order to properly condition the signal from the crystal so that it can be used to generate the system clock. Note that when a crystal is used as clock source 12, an output pin 15 is also required so that waveform shaping logic 16 can supply a stimulus to the crystal.

The first step then is to convert the trapezoid wave from the crystal to a square wave. The waveform shaping logic 16, contains hysteresis buffers, level shifting logic, current limiting resistors, and other logic that together serve the purpose of converting the trapezoid wave from clock source 12 into a square wave of the same frequency which is output as CLOCK #2.

The clock mode pin 20 is used as a control input to the waveform shaping logic 16. Clock mode pin 20 is used to determine whether or not part of the internal circuitry in the waveform shaping logic circuit 16 is bypassed. Thus clock mode pin 20 is used to select whether the data processing system 10 is in a first clock mode or a second clock mode. If the clock mode pin 20 is a digital logic level one, then all of the waveform shaping logic 16 is used. If the clock mode pin 20 is a digital logic level zero, then some of the waveform shaping logic 16 is bypassed and not used. For the first type of periodic signal, the user sets the clock mode pin 20 to be a digital logic level one so that all of the waveform shaping logic 16 is used.

The second step, which is required because a slow crystal is being used, is to increase the frequency of CLOCK #2 to match the desired frequency of the system clock. The third step is to minimize the skew between the clock pulses that are being sent out as system clock pulses and the clock pulses being received from clock source 12. Both of these functions are performed by the phase lock loop and control logic 18.

Multiplexer 30 uses the power and control pin 22 as a control input to determine whether to output CLOCK #1 or CLOCK #2 as the output CLOCK A. Multiplexer 30 selects and outputs CLOCK #2 when the user places a positive power supply voltage on the power and control pin 22. Multiplexer 30 selects and outputs CLOCK #1 when the user grounds the power and control pin 22. For the first type of periodic signal, where the user has placed a positive power supply voltage on the power and control pin 22, multiplexer 30 outputs CLOCK #2 as CLOCK A.

CLOCK A is then fed into the phase lock loop 32. Because the user has placed a positive power supply voltage on the power and control pin 22, all portions of the circuitry in the phase lock loop 32 are receiving power from either the power only pin 24 or the power and control pin 22. Thus the phase lock loop circuit 32 operates as a standard phase lock loop.

Multiplexer 58 is used to determine which signal CLOCK A is to be synchronized to. Multiplexer 58 uses the mode clock pin 20 as a control input to determine whether to output the system clock or the output of modulo counter 60 as the feedback input to phase detector 54. Multiplexer 58 selects and outputs the signal from the modulo counter 60 when the user places a digital logic level one on the mode clock pin 20. Multiplexer 58 selects and outputs the system clock when the user places a digital logic level zero on the mode clock pin 20. Again, the clock mode pin 20 is used to select whether the data processing system 10 is in a first clock mode or a second clock mode.

For the first type of periodic signal, where the user has placed a digital logic level one on the clock mode pin 20, multiplexer 58 outputs the signal from the modulo counter 60. The output from the modulo counter 60 has the same phase relationship as the system clock, but is the same frequency as CLOCK A. The system clock input to multiplexer 58 could not be used in this case because the frequency of the system clock is not necessarily the same as the frequency of CLOCK A. The frequency of the system clock is generally much higher than the frequency of CLOCK A for the first type of periodic signal.

The phase detector 54 then determines the phase relationship of CLOCK A and the output of multiplexer 58. In the present embodiment, the user can use the phase lock loop circuit 32 to selectively program the desired system clock frequency and to lock the phase relationship of the incoming CLOCK A with the output of multiplexer 58.

Multiplexer 34 uses the power and control pin 22 as a control input to determine whether to output CLOCK A or CLOCK B as the system clock. Multiplexer 34 selects and outputs CLOCK B when the user places a positive power supply voltage on the power and control pin 22. Multiplexer 34 selects and outputs CLOCK A when the user grounds the power and control pin 22. For the first type of periodic signal, where the user has placed a positive power supply voltage on the power and control pin 22, multiplexer 34 outputs CLOCK B as the system clock.

The second type of periodic signal will now be discussed. The second type of periodic signal is a high frequency periodic signal, from either a crystal oscillator or a non-crystal clock source, that needs less conditioning. For the second type of periodic signal, the user places a digital logic level zero on the clock mode pin 20. The user also places a positive power supply voltage on the power and control pin 22. Thus all of the circuits that receive their power inputs from the power and control pin 22 will be powered and functional. As a result, the waveform shaping logic circuit 16 is powered and functional. And, in the phase lock loop circuit 32, the low pass filter 62 and the voltage controlled oscillator 64 are powered and functional. In the present embodiment, a positive power supply voltage on the power and control pin 22 represents a digital logic level one when the pin 22 is being used as a control input.

For the second type of periodic signal, clock source 12 generates an external clock signal that is the desired frequency of the system clock. Because this external clock signal is allowed to be a trapezoid wave rather than a square wave, this external clock signal must still be conditioned by the waveform shaping logic 16. Waveform shaping logic 16 ensures that the CLOCK #2 signal that it produces is a square wave with the same frequency as the external clock signal it receives. Note that output pin 15 is not used for the second type of periodic signal.

However, because the external clock signal is usually a much higher frequency than was used in the first type of periodic signal, some of the internal circuitry in the waveform shaping logic 16 must be bypassed due to speed considerations. Because the clock mode pin 20 is a digital logic level zero, some of the internal logic in the waveform shaping logic 16 is bypassed and not used.

The second step, increasing the frequency of CLOCK #2 to match the desired frequency of the system clock, is not required because CLOCK #2 is already the desired frequency of the system clock. The third step, minimizing the skew between the clock pulses that are being sent out as system clock pulses and the clock pulses being received from the clock source 12, is still required. Both of these functions are performed by the phase lock loop and control logic 18.

Because the user has placed a positive power supply voltage on the power and control pin 22, multiplexer 30 selects and outputs CLOCK #2 as CLOCK A. CLOCK A is then fed into the phase lock loop 32. Because the user has placed a positive power supply voltage on the power and control pin 22, all portions of the circuitry in the phase lock loop 32 are receiving power from either the power only pin 24 or the power and control pin 22. The phase lock loop circuit 32 operates as a standard phase lock loop.

Because the user has placed a digital logic level zero on the clock mode pin 20, multiplexer 58 selects and outputs the system clock. The system clock is the same frequency as CLOCK A. The phase detector 54 then determines the phase relationship of CLOCK A and the system clock. In the present embodiment, the user can use the phase lock loop circuit 32 to lock the phase relationship of the incoming CLOCK A with the output of multiplexer 58. This phase locking ensures that the system clock is in phase with the signal from the clock source 12. Because the user has placed a positive power supply voltage on the power and control pin 22, multiplexer 34 selects and outputs CLOCK B as the system clock.

The third type of periodic signal will now be discussed. For the third type of periodic signal, the clock mode pin 20 has no effect and the user can place any digital value on the clock mode pin 20. Note that output pin 15 is not used for the third type of periodic signal.

For the third type of periodic signal, the user must couple the power and control pin 22 to ground. Thus all of the circuits that receive their power inputs from the power and control pin 22 will not be powered, thus will not be functional, will not be used, and will not be dissipating unnecessary power. As a result, the waveform shaping logic circuit 16 is not powered, not functional, not used, and not dissipating unnecessary power. And, in the phase lock loop circuit 32, the low pass filter 62 and the voltage controlled oscillator 64 are not powered, not functional, not used, and not dissipating unnecessary power. In the present embodiment, grounding the power and control pin 22 represents a digital logic level zero when the pin 22 is being used as a control input.

For the third type of periodic signal, the user wants to bypass the phase lock loop circuitry 32 in order to allow the user to dynamically vary the system clock frequency during operation of the data processing system 10. If the phase lock loop circuitry 32 was not bypassed, the phase lock loop circuitry 32 would cause a significant lag between a frequency change in the external clock signal and the corresponding frequency change in the system clock. This lag or delay in the change of the system clock frequency is not acceptable to some customers.

For the third type of periodic signal, an external clock source is used as clock source 12 to generate a square wave external clock signal that is the desired frequency of the system clock and that is used to direct drive the system clock without using the phase lock loop 32. This external clock signal must meet the requirements for a square wave because no conditioning is performed by the waveform shaping logic 16. The external clock signal is fed directly into the phase lock loop and control logic 18 as the CLOCK #1 input.

The second step, increasing the frequency of CLOCK #2 to match the desired frequency of the system clock, is not required because CLOCK #1 is already the desired frequency of the system clock. The third step, minimizing the skew between the clock pulses that are being sent out as system clock pulses and the clock pulses being received from the clock source 12, is not desired by the user in this case. Both of these functions are performed by the phase lock loop and control logic 18.

Because the user has grounded the power and control pin 22, multiplexer 30 selects and outputs CLOCK #1 as CLOCK A. CLOCK A is then fed into the phase lock loop 32. Because the user has grounded the power and control pin 22, the portions of the circuitry in the phase lock loop 32 which use the power and control pin 22 as power inputs are not receiving power. However, the portions of the circuitry in the phase lock loop 32 which use the power only pin 24 as power inputs are still receiving power. The phase lock loop circuit 32 no longer operates as a standard phase lock loop. Multiplexer 58 is not used.

Other embodiments of the present invention could have used the power and control pin 22 to supply the power inputs to all of the portions of circuitry in phase lock loop 32 that were not required for the third type of periodic signal, which in the present embodiment is all of the phase lock loop circuitry 32. This would even further reduce the unnecessary power dissipation. The present embodiment did not do this, however, because some of the phase lock loop circuitry 32 was taken from a previous design and because the power and control pin 22 was used to supply "clean" power to some of the circuitry in the phase lock loop 32. "Clean" power is a power source that has little noise. The more circuitry that is powered by a power source, the more noise that is generated. Thus there is a trade-off between the amount of circuitry which uses the power and control pin 22 as a power source and the amount of noise generated.

Referring to FIG. 2, the present embodiment required the use of two multiplexers, multiplexer 30 and multiplexer 34. This was because some of the circuitry was taken from a prior design. An alternate embodiment of the present invention could be made using multiplexer 34 as the only multiplexer. Multiplexer 30 would not be needed. In this alternate embodiment, CLOCK #2 would be input directly into phase lock loop 32. CLOCK #1 would be input directly into multiplexer 34. Thus phase lock loop 32 would receive CLOCK #2 instead of CLOCK A as an input. Multiplexer 34 would then select between CLOCK #1 and CLOCK B from the phase lock loop 32.

In addition, in an alternate embodiment, if the power and control pin 22 was used to supply the power inputs to all of the portions of circuitry in phase lock loop 32, then the phase lock loop 32 would not need any power input from the power only pin 24.

In summation, the present invention allows a power pin to be used simultaneously as both a power pin and a control pin. This power pin can be used as only a power pin by a first circuit, used as only a control pin by a second circuit, and used as both power and control by a third circuit. Using a power pin to supply both power and control allows a user selectable function, such as the type of periodic signal that is input from a clock source 12, to be grafted onto the primary function of the power pin, i.e. supplying power. It also allows power consumption to be reduced when a circuit is not required by the user. Using a power pin as a power and control pin is especially useful in the context of controlling how the system clock on a chip will be generated.

While the present invention has been illustrated and described with reference to specific embodiments, further modifications and improvements will occur to those skilled in the art. For example, the data processing system 10 may or may not be contained on a single semiconductor chip. Although the conditioning circuitry in the present embodiment included the waveform shaping logic 16 and the phase lock loop circuitry 32, different or additional conditioning logic could be used in other embodiments. Although the clock output from multiplexer 34 was used as a system clock in the present embodiment, the clock output from multiplexer 34 could be used for a different purpose.

Clock source 12 can be any frequency allowed by the data processing system 10. Although the present embodiment discloses three type of periodic signals that can be input from clock source 12, other embodiments could use more or less types, and even different types. Also, a power and control pin 22 could be used to combine power and control functions for other types of circuitry, not just the circuitry that is used to generate the system clock. Various circuits could be used to implement multiplexer 30, phase lock loop 32, and multiplexer 34.

It is to be understood, therefore, that this invention is not limited to the particular forms illustrated and that it is intended in the appended claims to cover all modifications that do not depart from the spirit and scope of this invention.

We claim:

1. A method for operating an integrated circuit, the integrated circuit having a first circuit, a second circuit, and a third circuit, the third circuit having a control input and having an output for providing an output signal, the method comprising the steps of:

providing a first power signal to the first circuit in order to provide power to the first circuit;

providing a second power signal to the second circuit in order to selectively provide power to the second circuit;

providing the first power signal to the third circuit in order to provide power to the third circuit; and providing the second power signal to the control input of the third circuit; and controlling the output signal of the third circuit via the second power signal;

wherein all of said steps are performed concurrently during at least a portion of time in which the integrated circuit is operating.

2. A method as in claim 1, further comprising the step of:

providing a ground signal to the first circuit, the second circuit, and the third circuit during said at least the portion of time in which the integrated circuit is operating; and wherein a voltage level of the ground signal remains essentially constant at a first voltage level during said at least the portion of time in which the integrated circuit is operating.

3. A method as in claim 2, wherein a voltage level of the first power signal remains essentially constant at a second voltage level during said at least the portion of time in which the integrated circuit is operating, and wherein a voltage level of the second power signal may vary significantly from the first voltage level to the second voltage level during said at least the portion of time in which the integrated circuit is operating.

4. A method as in claim 3, wherein said step of providing the second power signal to the second circuit further comprises the steps of:

if the voltage level of the second power signal is at the first voltage level, providing essentially no power to the second circuit during said at least the portion of time in which the integrated circuit is operating; and if the voltage level of the second power signal is at the second voltage level, providing power to the second circuit during said at least the portion of time in which the integrated circuit is operating.

5. A method as in claim 1, further comprising the steps of:

providing a first clock signal to the third circuit; and providing a second clock signal to the third circuit; and wherein said step of providing the second power signal to the third circuit comprises the steps of:

selecting, based upon a voltage level of the second power signal, a selected one of the first clock signal and the second clock signal; and providing the selected one of the first clock signal and the second clock signal as the output.

6. An integrated circuit, comprising:

a first power conductor for providing control information and for providing power, said first power conductor having one of a first voltage state and a second voltage state during operation of said integrated circuit;

a second power conductor for providing power, said second power conductor having the second voltage state during operation of said integrated circuit;

a ground conductor for providing grounding, said ground conductor having the first voltage state during operation of said integrated circuit;

a first circuit, having a power input coupled to said first power conductor and having a ground input coupled to said ground conductor, said first circuit performing a first function in the integrated circuit; and a second circuit, having a power input coupled to said second power conductor, having a ground input coupled to said ground conductor, having a control input coupled to said first power conductor, and having an output, said second circuit performing a second function in the integrated circuit.

7. An integrated circuit as in claim 6, wherein during operation of said integrated circuit said first circuit receives essentially no power and does not operate when said first power conductor has the first voltage state, and wherein during operation of said integrated circuit said first circuit receives power and operates when said first power conductor has the second voltage state.

8. An integrated circuit as in claim 7, wherein during operation of said integrated circuit, said second circuit receives essentially all of the power used to power said second circuit from said second power conductor and receives essentially none of the power used to power said second circuit from said first power conductor, and wherein during operation of said integrated circuit said second circuit provides a first output signal at the output when said first power conductor has the first voltage state and provides a second output signal at the output when said first power conductor has the second voltage state.

9. An integrated circuit as in claim 6, wherein said second circuit comprises:

a multiplexer.

10. An integrated circuit as in claim 9, wherein said second circuit further comprises:

a first signal input for receiving a first clock signal; and a second signal input for receiving a second clock signal; wherein a first one of the first clock signal and the second clock signal is provided at the output when the first power conductor has the first voltage state, and wherein a second one of the first clock signal and the second clock signal is provided at the output when the first power conductor has the second voltage state.

11. A method for operating an integrated circuit, the integrated circuit having data processing circuitry, having a clock generation circuit, and having a multiplexer circuit, the method comprising the steps of:

providing a first power signal to the data processing circuitry in order to continuously provide power to the data processing circuitry during operation of the integrated circuit;

providing a second power signal to the clock generation circuit in order to selectively provide power to at least a portion of the clock generation circuit during operation of the integrated circuit;

providing a plurality of clock signals from the clock generation circuit to the multiplexer circuit;

providing the first power signal to the multiplexer circuit in order to continuously provide power to the multiplexer circuit during operation of the integrated circuit;

providing the second power signal to the multiplexer circuit as a control input in order to select a first one of the plurality of clock signals to provide as a multiplexer output;

providing the first one of the plurality of clock signals to the data processing circuitry; and clocking at least a portion of the data processing circuitry via the first one of the plurality of clock signals.

12. A method as in claim 11, further comprising the step of:

receiving a clock mode signal from external to the integrated circuit.

13. A method as in claim 11, further comprising the step of:

providing the first power signal to the data processing circuitry via a first integrated circuit terminal; and providing the second power signal to the data processing circuitry via a second integrated circuit terminal.

14. A method as in claim 11, further comprising the step of:

providing a waveform shaping circuit and a phase lock loop circuit as part of the clock generation circuit.

15. A method as in claim 11, further comprising the step of:

if a voltage level of the second power signal is at a first voltage level, providing essentially no power to said at least a portion of the clock generation circuit during operation of the integrated circuit; and if the voltage level of the second power signal is at a second voltage level, providing power to said at least a portion of the clock generation circuit during operation of the integrated circuit.

16. An integrated circuit, comprising:

a first power terminal for providing control information and for providing power, said first power terminal having a first voltage state and a second voltage state;

a second power terminal for providing power;

first logic means for receiving a first clock signal and for selectively generating a second clock signal, the first logic means receiving power from the first power terminal and generating the second clock signal when the first power terminal is in the second voltage state, the first logic means not generating the second clock signal when the first power terminal is in the first voltage state, the first logic means being coupled to the first power terminal; and second logic means for selecting and outputting the first clock signal as an output clock signal when the first power terminal is in the first voltage state, and for selecting and outputting the second clock signal as the output clock signal when the first power terminal is in the second voltage state, said second logic means being coupled to the first power terminal for receiving control information, being coupled to the second power terminal for receiving power, and being coupled to the first logic means for receiving the first and second clock signals.

17. An integrated circuit as in claim 16, wherein the second logic means comprises:

a multiplexer circuit.

18. An integrated circuit as in claim 17, wherein the first logic means comprises:

a phase lock loop circuit.

19. An integrated circuit as in claim 18, wherein the first logic means further comprises:

a waveform shaping circuit.

20. An integrated circuit as in claim 16, wherein the first logic means is coupled to the second power terminal for receiving power from the second power terminal.

21. An integrated circuit, comprising:

a first power conductor for providing control information to the integrated circuit and for providing power to the integrated circuit;

a second power conductor for providing power to the integrated circuit; and a reference conductor for providing a reference voltage to the integrated circuit;

wherein a first portion of the integrated circuit comprises:

a first power input coupled to said first power conductor for receiving power; and a first reference input coupled to said reference conductor;

and wherein a second portion of the integrated circuit comprises:

a second power input coupled to said second power conductor for receiving power;

a second reference input coupled to said reference conductor; and a control input coupled to said first power conductor for receiving said control information.

22. An integrated circuit as in claim 21, further comprising:

a first integrated circuit terminal coupled to said first power conductor;

a second integrated circuit terminal coupled to said second power conductor; and a third integrated circuit terminal coupled to said reference conductor.

23. An integrated circuit as in claim 22, wherein during a first time period a non-ground voltage is provided to the first integrated circuit terminal, the non-ground voltage is provided to the second integrated circuit terminal, and an approximately ground voltage is provided to the third integrated circuit terminal, and during a second time period the approximately ground voltage is provided to the first integrated circuit terminal, the non-ground voltage is provided to the second integrated circuit terminal, and the approximately ground voltage is provided to the third integrated circuit terminal.

24. An integrated circuit as in claim 23, wherein the non-ground voltage provided to the first integrated circuit terminal during the first time period is essentially the same as the non-ground voltage provided to the second integrated circuit terminal during the first time period.

25. An integrated circuit as in claim 21, wherein the first and second power conductors provide power at approximately a same voltage.

26. An integrated circuit as in claim 21, wherein a third portion of the integrated circuit comprises:

a third power input coupled to said second power conductor for receiving power; and a third reference input coupled to said reference conductor.

27. An integrated circuit, comprising:

a first integrated circuit terminal for providing power to at least a first portion of the integrated circuit;

a second integrated circuit terminal for providing power; to at least a second portion of the integrated circuit and for providing control to said at least the first portion of the integrated circuit; and a third integrated circuit terminal for providing a reference voltage to said at least the first portion of the integrated circuit and to said at least the second portion of the integrated circuit.

* * * * *

UNITED STATES PATENT AND TRADEMARK OFFICE
CERTIFICATE OF CORRECTION

PATENT NO.  : 5,535,398
DATED       : July 9, 1996
INVENTOR(S) : Biggs et al

It is certified that error appears in the above-indentified patent and that said Letters Patent is hereby corrected as shown below:

Column 16, line 27:   Change "power;" to           --power--

Signed and Sealed this

Twenty-third Day of September, 1997

Attest:

BRUCE LEHMAN

Attesting Officer     Commissioner of Patents and Trademarks